United States Patent [19]

Ishii

[11] Patent Number: 5,010,379
[45] Date of Patent: Apr. 23, 1991

[54] SEMICONDUCTOR MEMORY DEVICE WITH TWO STORAGE NODES

[75] Inventor: Tatsuya Ishii, Hyogo, Japan

[73] Assignee: Mitsubishi Denki Kabushiki Kaisha, Tokyo, Japan

[21] Appl. No.: 369,965

[22] Filed: Jun. 22, 1989

[30] Foreign Application Priority Data

Aug. 26, 1988 [JP] Japan .................. 63-213209

[51] Int. Cl.⁵ ............... H01L 27/10; H01L 29/06; H01L 27/02
[52] U.S. Cl. .................. 357/23.6; 357/45; 357/55; 357/51
[58] Field of Search ............... 357/23.6, 45, 55, 51

[56] References Cited

U.S. PATENT DOCUMENTS

| | | | |
|---|---|---|---|
| 4,673,962 | 6/1987 | Chatterjee et al. | 357/23.6 |
| 4,763,179 | 8/1988 | Tsubouchi et al. | 357/23.6 |
| 4,785,337 | 11/1989 | Kenney | 357/23.6 |
| 4,786,954 | 11/1988 | Morie et al. | 357/23.6 |
| 4,922,313 | 5/1990 | Tsuchiya | 357/23.6 |

FOREIGN PATENT DOCUMENTS

DE 3530777 3/1986 Fed. Rep. of Germany .
DE 3543937 12/1986 Fed. Rep. of Germany .
DE 3642234 6/1987 Fed. Rep. of Germany .
88555 5/1986 Japan .

OTHER PUBLICATIONS

IEEE Journal of Solid State Circuits, vol. SC-20, No. 5, Oct. 1985, pp. 909-913, "A Reliable 1-Mbit Dram with a Multi-Bit Test Mode," by Kumanoya et al.

Primary Examiner—William Mintel
Assistant Examiner—Roy Potter
Attorney, Agent, or Firm—Lowe, Price, LeBlanc, Becker & Shur

[57] ABSTRACT

A semiconductor memory device includes a p-type semiconductor substrate (1), a trench (16) formed on the substrate (1), a first region (19) of a capacitor cell plate formed on the side walls and the bottom surface of the trench (16) and formed by an n-type impurity layer, two capacitor storage nodes (2a) having their surfaces covered by capacitor dielectric films (7a, 8a) and formed along the side walls of the trench (16) for facing to each other, a second region (3a) of the cell plate formed of an electrically conductive material, the second region (3a) being interposed between the two storage nodes (2a) and connected to the first region (19) of the cell plate at the bottom surface of the trench (16), and n-channel type field effect transistors (9, 10, 12, 18, 28) each connected to one of the storage nodes (2a) and formed on the substrate (1).

15 Claims, 19 Drawing Sheets

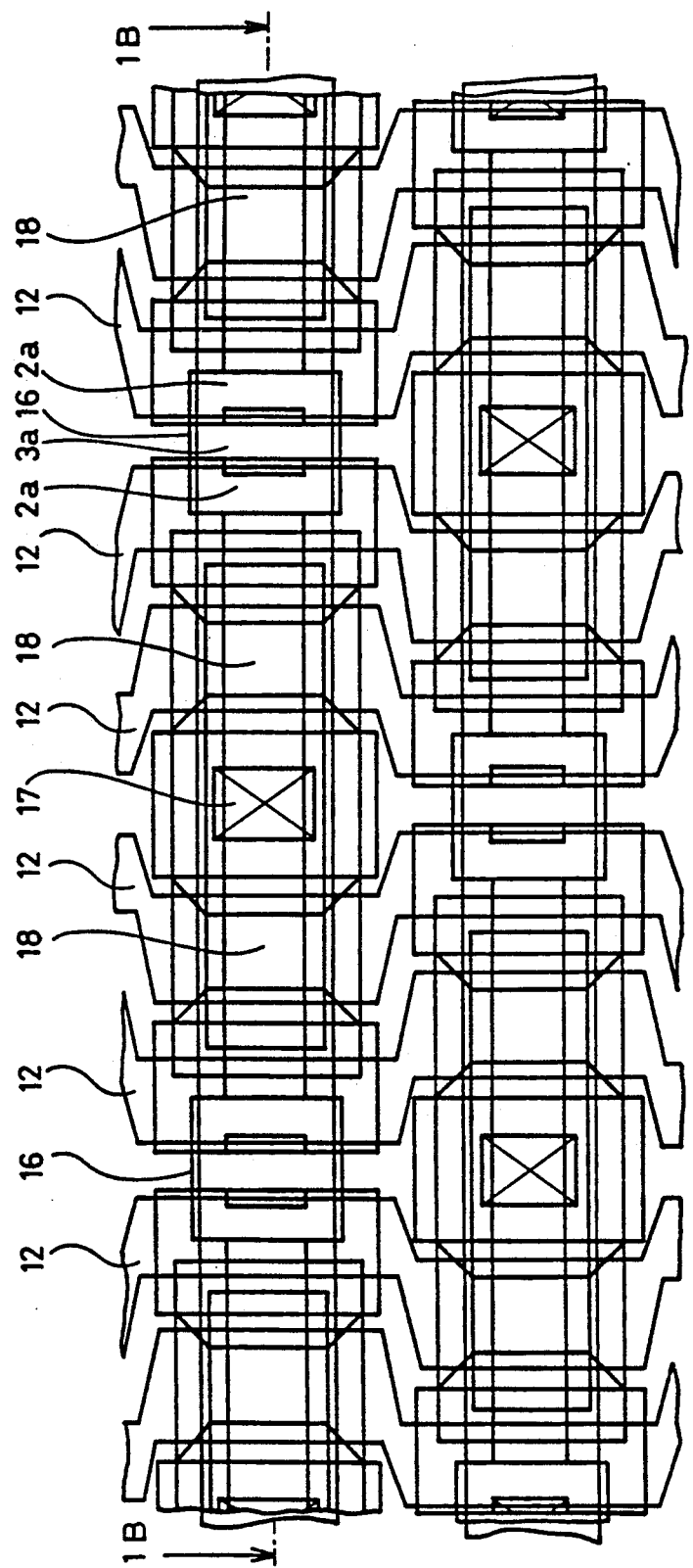

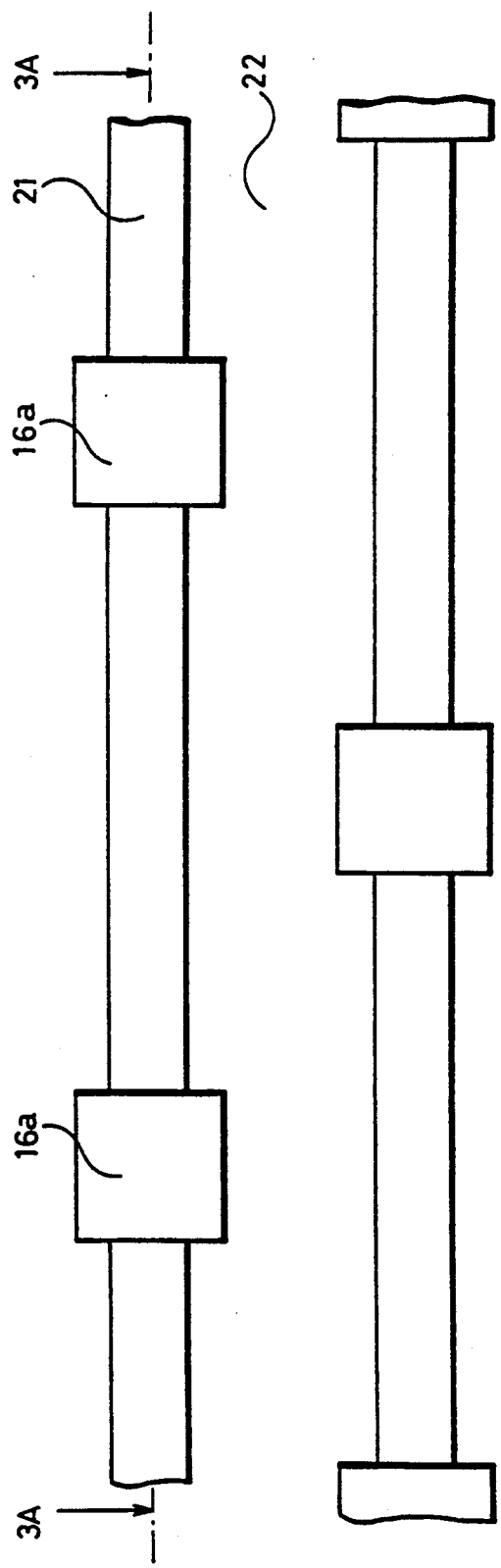

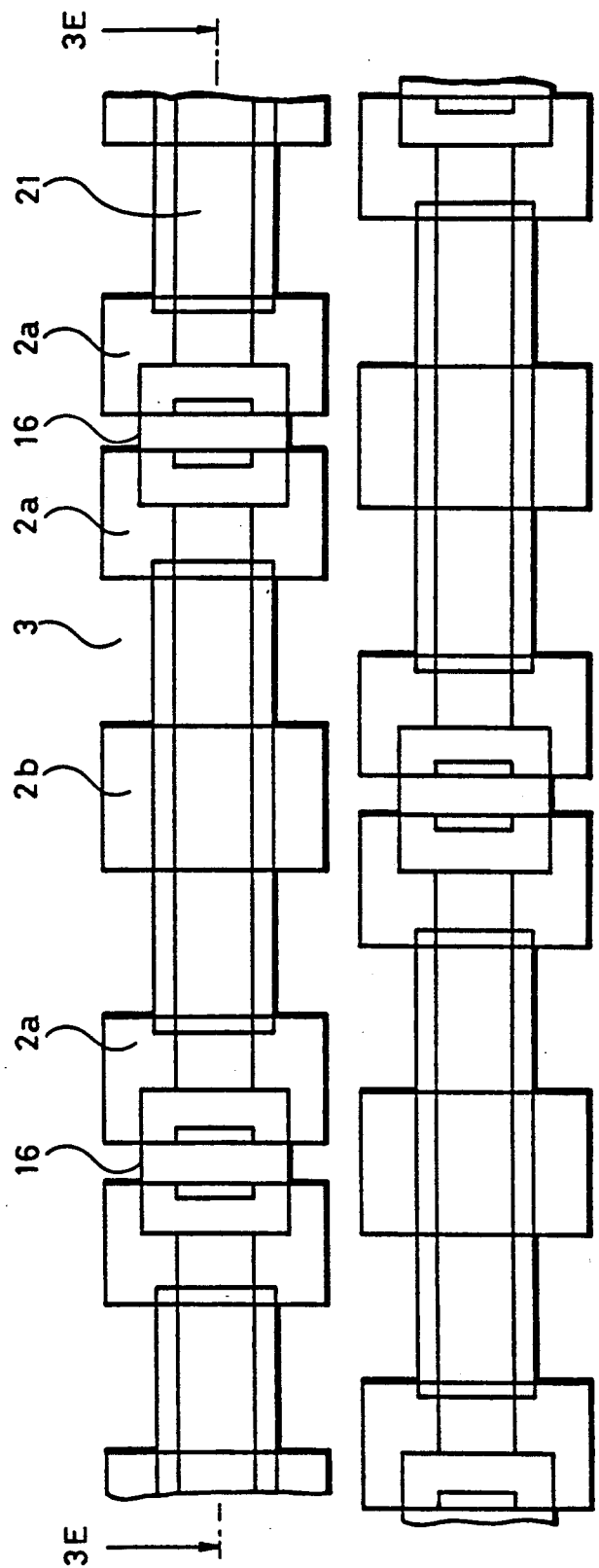

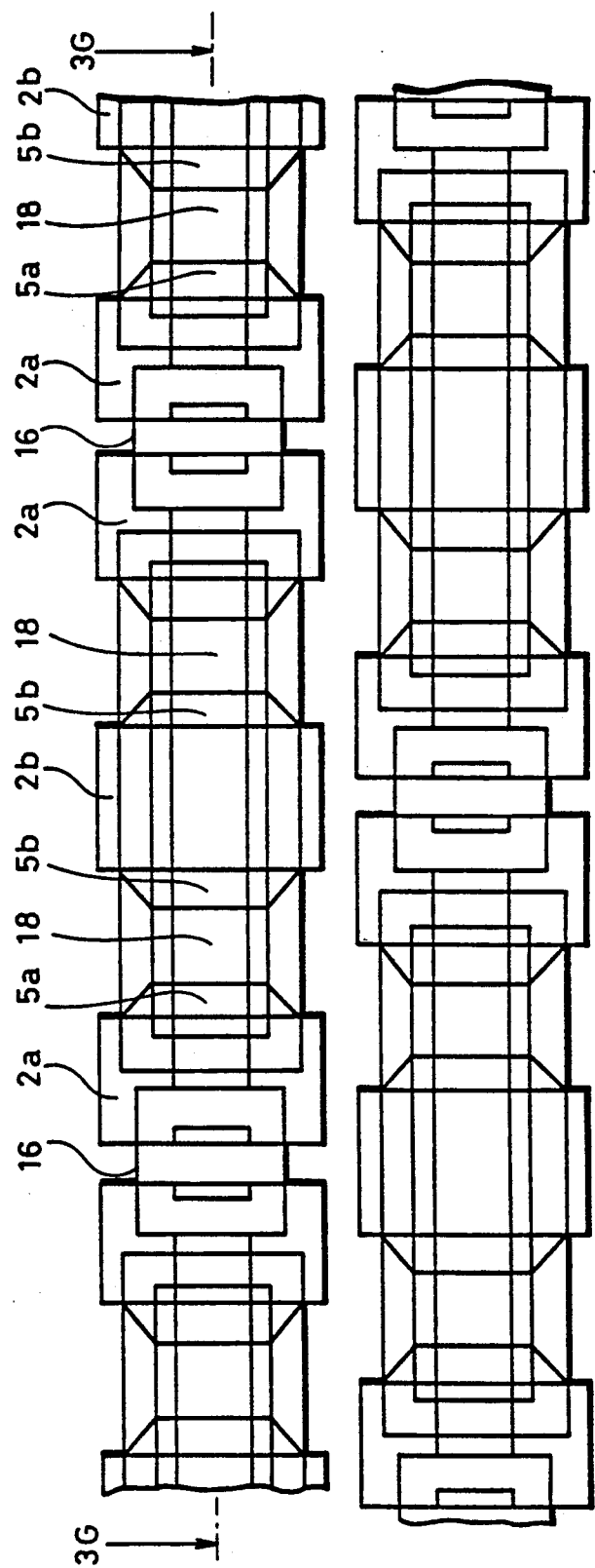

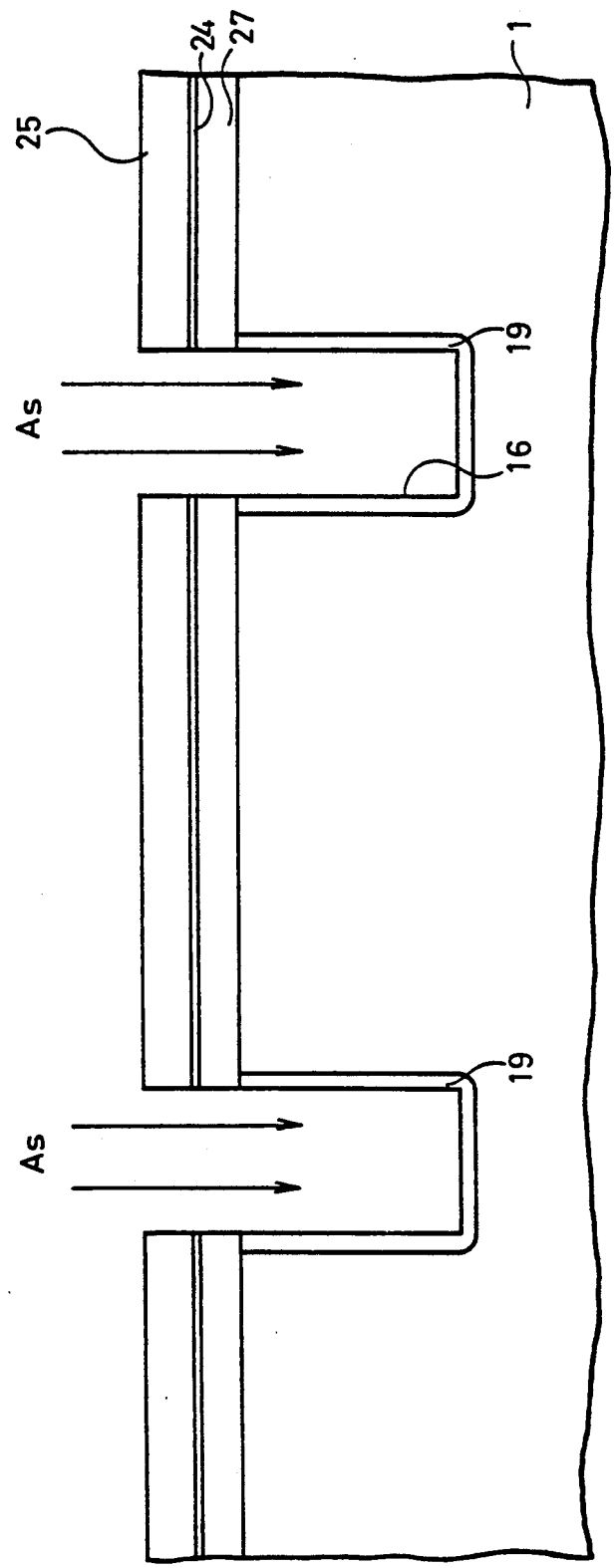

SEMICONDUCTOR MEMORY DEVICE WITH TWO STORAGE NODES

BACKGROUND OF THE INVENTION

1. Field of the Invention

This invention relates to a semiconductor memory device including a plurality of memory cells each including a transistor and a capacitor and, more particularly, to such a semiconductor memory device which is improved both in integration degree and operational reliability.

2. Description of the Prior Art

FIG. 4A is a block diagram showing an example of a dynamic random access memory (RAM) device, and FIG. 4B is a circuit diagram showing a RAM cell. Referring to these figures, an array of memory cells 101 includes a plurality of memory cells arranged in a matrix configuration. These memory cells are arranged at the points of intersection between a plurality of word lines 110 connected to an X address buffer decoder 102 and a plurality of bit lines 107 connected to a Y address buffer decoder 103. Each memory cell includes a field effect transistor 108 and a capacitor 109. Each capacitor 109 has its one electrode 111 connected to the field effect transistor 108 and is called a storage node, and the other 112 is called a cell plate or common electrode.

During data writing, the field effect transistor 108 is turned on as a predetermined potential is applied to the word line 110, such that the charges supplied from the bit line 107 are stored in the capacitor 109. Conversely, during data read-out, the field effect transistor 108 is turned on as a predetermined potential is applied to the word line, such that the charges stored in the capacitor are taken out via the bit line 107.

When a memory cell to which data should be written or from which data should be read out is selected, one word line 110 is selected by the X address buffer decoder 102 and one bit line 107 is selected by the Y address buffer decoder 103. That is, that memory cell which is arranged at the point of intersection between the selected word line 110 and the selected bit line 107 is selected.

A read/write control circuit 104 controls data read out or writing in dependence upon a read/write control signal R/W. During data writing, an input data Din is applied to the selected memory cell via the read/write control circuit 104 and a sense amplifier 105. During data read-out, the data stored in the selected memory cells are detected and amplified by the sense amplifier 105 so as to be taken out via a data output buffer 106 as output data Dout.

Recently, for improving the integration degree and the operational reliability of a dynamic RAM device, a variety of trench type capacitors for memory cells have been proposed. FIG. 5 is a diagrammatic sectional view showing a pair of memory cells having trench type capacitors as disclosed in Japanese Patent Laying-Open Gazette No. 88555/1986. In this figure, a trench h is formed on a planar surface of a p-type semiconductor substrate 211 and a pair of capacitors are formed in the trench h. A polysilicon region 230, supplied with a reference potential from the substrate 211, acts as a cell plate for the two capacitors and also as a separation region between these two capacitors. Signal charges are stored in a polysilicon storage node 217 arranged along sidewalls of the trench h and having their surface covered by silicon oxide films 218a, 218b. Hence, by forming the trench h to a larger depth, a large storage capacity may be obtained without increasing the planar area occupied by the capacitors.

Each of the pair of n-channel type field effect transistors includes a polysilicon gate electrode 213 connected to the word line, an n-type drain region 214 connected to the bit line, and an n-type source region 215 connected by the polysilicon source electrode 216 to one of the storage nodes 217. Below the n-type source region 215, a p+ impurity region 212 is formed, by which the source region 215 is isolated from a depletion layer formed on the substrate 211 by the potential of the storage node 217. Hence, the p+ impurity layer 212 is effective to prevent soft error caused by α particles.

In the memory cell of FIG. 5, the positive potential with respect to the p type substrate 211 is applied to the gate 213, such that channel region between the n type source 215 and the n type drain 214 is rendered conductive so that data can be written into or read out from the storage node 217.

The memory cell of FIG. 5 is a so-called substrate cell plate type memory cell in which the reference potential is applied from the semiconductor substrate 211 to the cell plate 230. However, with this construction, the noise potential of the semiconductor substrate 211 is reflected directly as the fluctuations in the cell plate potential to lower the noise margin of the memory cell. Moreover, since it is not possible with the substrate cell plate type memory cell to apply a potential different from the predetermined substrate potential to the cell plate 230, the cell plate potential cannot be adjusted in such a manner as to decrease the intensity of the electrical field applied to dielectric film 218a of the capacitor.

M. Kumanoya et al reports in IEEE J. Solid-State Circuits, vol. SC-18, pp 909 to 913 Oct., 1985 that, by applying a potential Vcc/2 (2V) different from the substrate potential Vss (0V) to the cell plate, the intensity of the electrical field applied to the dielectric film of the capacitor is decreased to improve the operational reliability of the memory cell. In this case, the "H" level signal voltage is 4V, and the "L" level signal voltage is 0V. That is, when the substrate potential Vss is applied to the cell plate, the dielectric film of the capacitor must withstand the intensity of the electrical field of 4V, whereas, when the potential Vcc/2 is applied to the cell plate, it is only necessary for the dielectric film to withstand the intensity of electrical field of 2V. This means that a larger thickness of dielectric film of the capacitor is required when the substrate potential is applied to the cell plate, and the thicker dielectric film of the capacitor are not desirable to the higher degree of integration of the RAM device.

Moreover, in FIG. 5, inasmuch as a depletion layer is formed in the substrate 211 due to the potential of the storage node 217, the silicon oxide film 218b practically does not play the role of the dielectric film of the capacitor. In order that not only the silicon oxide film 218a but also the silicon oxide film 218b may act as a dielectric film of the capacitor, it is sufficient to increase the concentration of the p type impurity in the substrate 211. However, when the impurity concentration of the substrate is increased, the threshold voltage of the field effect transistor is undesirably increased.

SUMMARY OF THE INVENTION

In view of the above described prior art, it is an object of the present invention to provide a semiconductor memory device which is improved not only in the integration degree but also in the operational reliability. In accordance with the present invention, there is provided a semiconductor memory device comprising a p-type semiconductor substrate having a planar surface, a trench formed on said planar surface and having sidewalls and a bottom surface, a first region of capacitor cell plate formed on said sidewalls and the bottom surface of said trench and formed by an n-type impurity layer, two capacitor storage nodes having the surfaces thereof covered by capacitor dielectric films and formed along the sidewalls of said trench for facing to each other, a second region of said cell plate formed of an electrically conductive material, said second region being interposed between said two storage nodes and connected to said first region of the cell plate at the bottom surface of said trench, and n-channel type field effect transistors each connected to one of said storage nodes and formed on said planar surface.

In the semiconductor memory device of the present invention, since the cell plate is isolated from the substrate by the p-n junction, a potential different from the substrate potential can be applied to the cell plate. This results in the lowered intensity of the electrical field applied to the dielectric films of the capacitors, and in the improved operational reliability of the semiconductor memory device. In addition, the both sides of the storage node of the capacitors face to the cell plate, the effective area of the capacitor is doubled to increase the integration degree of the semiconductor memory device. Also, the soft errors caused by electrons produced upon injection of the $\alpha$ particles may be decreased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1A is a diagrammatic view showing the plan layout of a semiconductor memory device according to an embodiment of the present invention;

FIGS. 2A to 2E are plan views for illustrating a process of preparing the semiconductor memory device shown in FIG. 1A and 1B;

FIGS. 3A to 3I are sectional views for illustrating the process for preparing the semiconductor memory device shown in FIGS. 1A and 1B;

BRIEF DESCRIPTION OF THE PREFERRED EMBODIMENTS

Figure 1B:
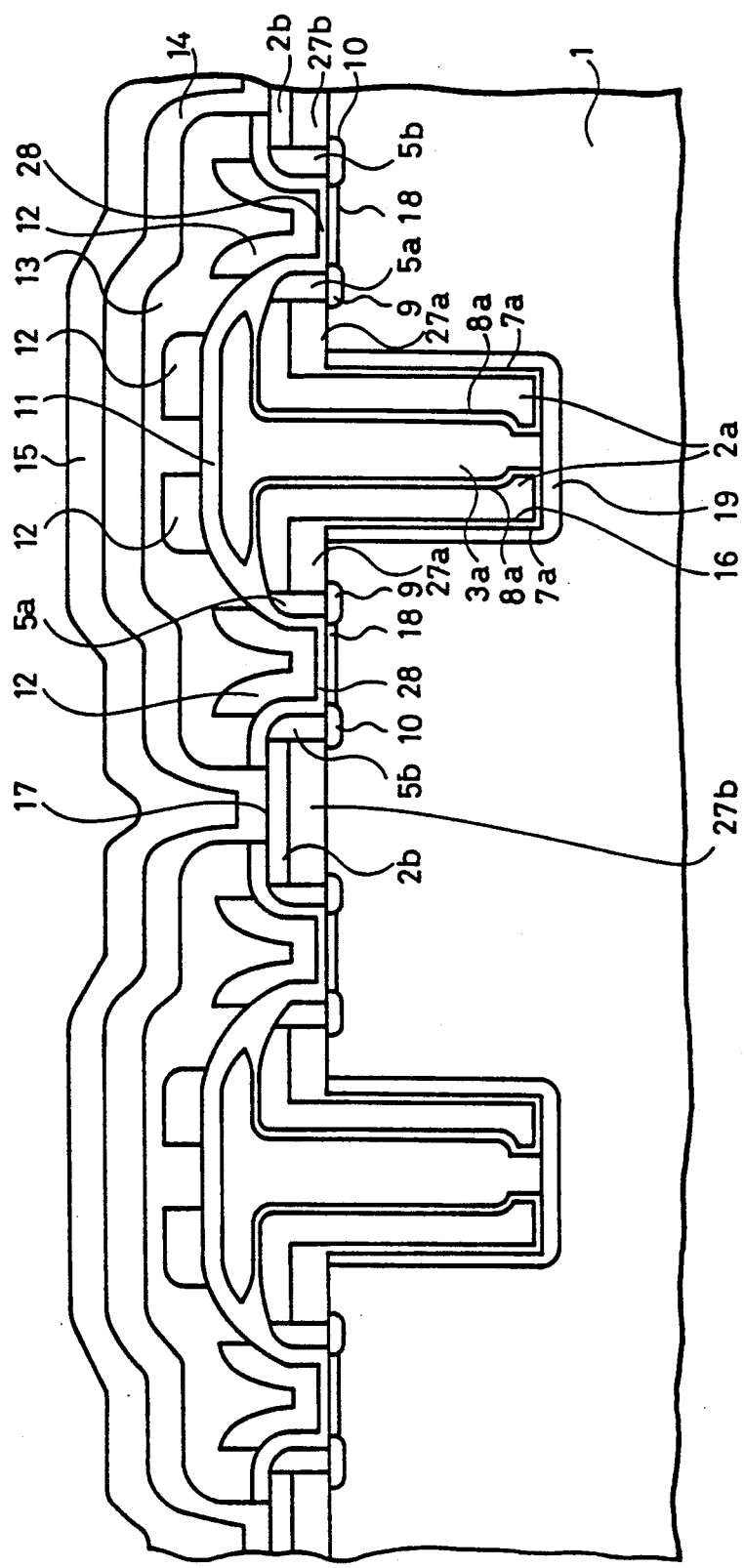
FIG. 1B is a section taken along a line 1B—1B of FIG. 1A.

FIG. 1A is a diagrammatic view showing the plan layout of a semiconductor memory device according to an embodiment of the present invention, and FIG. 1B is a sectional view taken along a line 1B—1B in FIG. 1A. In these figures, trenches 16 are formed on a planar surface of a p-type silicon monocrystal substrate 1. Formed on the lateral and bottom sides of the trench 16 is an n-type impurity layer 19 acting as a first region of a capacitor cell plate. Within the trench 16, a pair of capacitor storage nodes 2a, formed of polysilicon and having their surfaces covered by the capacitor dielectric films of silicon oxides 7a, 8a, are placed along the side walls of the trench 16 for facing to each other. Within the trench 16, a polysilicon region 3a acting as a second region of the cell plate is arranged between the storage nodes 2a so as to be continuous at the bottom side of the trench 16 with the first region 19 of the cell plate.

Each storage node 2a is connected to an n-type source region 9 of an n-channel field effect transistor via a polysilicon source electrode 5a. An n-type drain region 10 of the field effect transistor is connected to an aluminum bit line 14 within a contact hole 17 via a polysilicon drain electrode 5b and polysilicon connecting region 2b. A channel region 18 consisting of a p-type impurity layer is formed between the source 9 and the drain 10. Above the channel region 18, a polysilicon word line 12 used simultaneously as a gate electrode is formed via a silicon oxide gate electrode film 28.

A thicker silicon oxide film 27a formed on the surface of the substrate 1 is an oxide film isolating the source 9 of the field effect transistor and the first region 19 of the cell plate from each other, while a thicker silicon oxide film 27b is an oxide film isolating two adjacent field effect transistors. The cell plate 3a is covered by a silicon oxide film 11, the word line 12 is covered by a silicon oxide film 13, and the bit line 14 is covered by a superficial protective film 15 of silicon nitride.

In the semiconductor memory device shown in FIGS. 1A and 1B, the cell plate 3a and 19 is isolated from the substrate 1 by the p-n junction, so that a potential different from the substrate potential can be applied to the cell plate 3a and 19. Hence, the intensity of the electrical field applied to the dielectric films 7a and 8a of the capacitors can be decreased, while the semiconductor memory device can be improved in operational reliability. In addition, since the both sides of the storage nodes 2a of the capacitors face to the cell plate 3a and 19, the effective surface area of the capacitors can be doubled, so that the integration degree of the semiconductor memory device can be improved, while the soft errors caused by electrons produced upon injection of $\alpha$ particles can also be reduced.

FIGS. 2A to 2E and FIGS. 3A to 3I are plan and sectional views, respectively, illustrating a typical production process for the semiconductor memory device shown in FIGS. 1A and 1B.

Figure 2A:
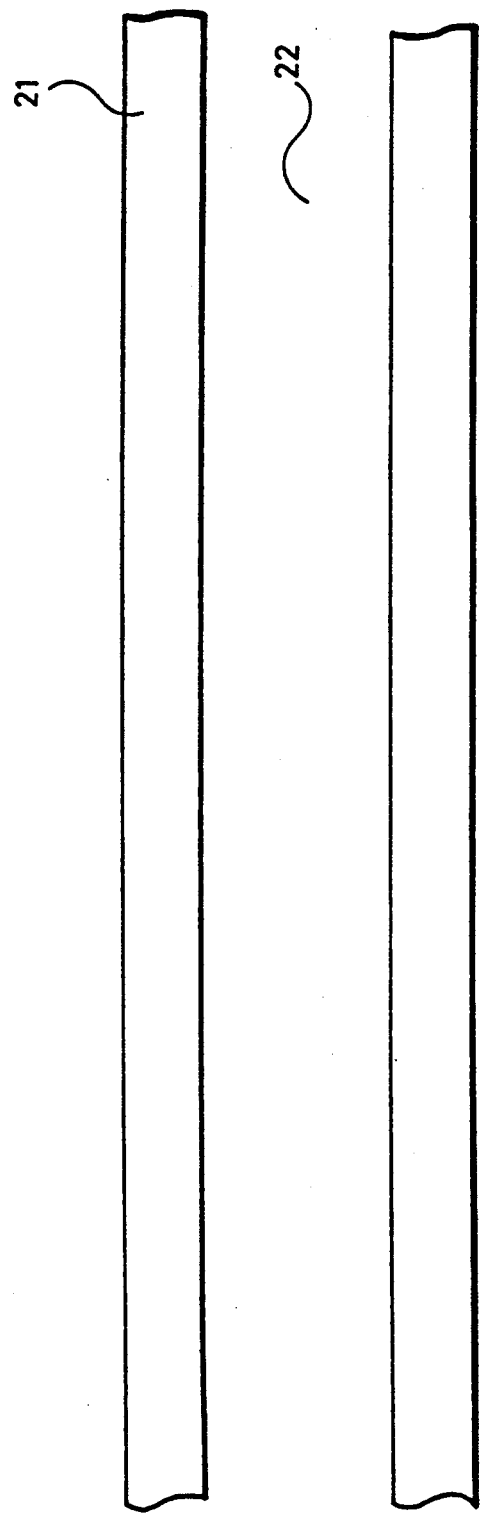

Referring to FIG. 2A, an isolation region 22 of a thicker silicon oxide film is formed between two device regions 21 on the planar surface of a p-type silicon monocrystal substrate 1.

Figure 3A:
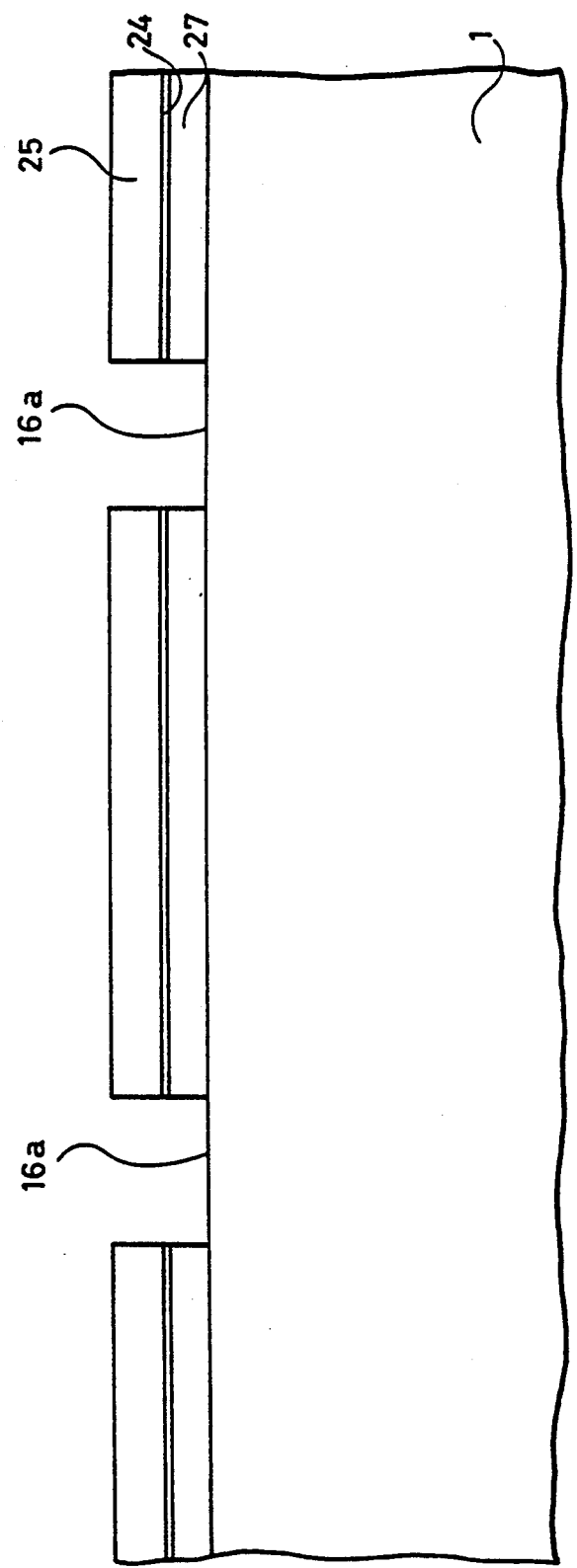

Referring to FIG. 2B and to FIG. 3A which is a sectional view taken along a line 3A—3A of FIG. 2B, a thicker silicon oxide film 27, a thin silicon nitride film 24 and a thicker silicon oxide film 25 are deposited in this order on the overall planar surface of the substrate 1 by a chemical vapor deposition process. Then, a patterning is conducted for exposing portions 16a of the silicon substrate 1 in which trenches are to be formed.

Figure 3B:
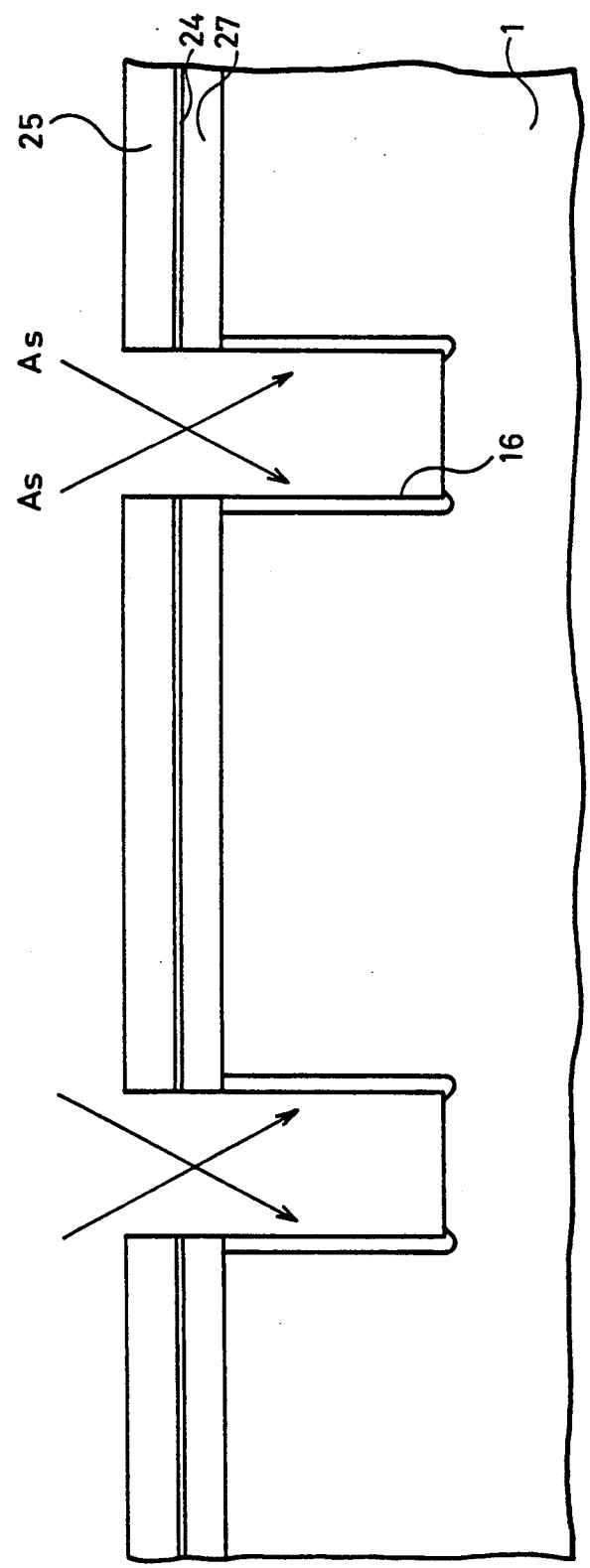

Referring to FIGS. 3B and 3C, trenches 16 are formed by reactive ion etching (RIE) with the silicon oxide film 25 as a mask. Then, by rotating oblique ion implantation, arsenic or phosphorus ions are injected into the lateral side of the trench 16 while arsenic or phosphorus ions are also injected on the bottom side of the trench 16 from above, thereby forming an n-type impurity layer 19.

Figure 2C:
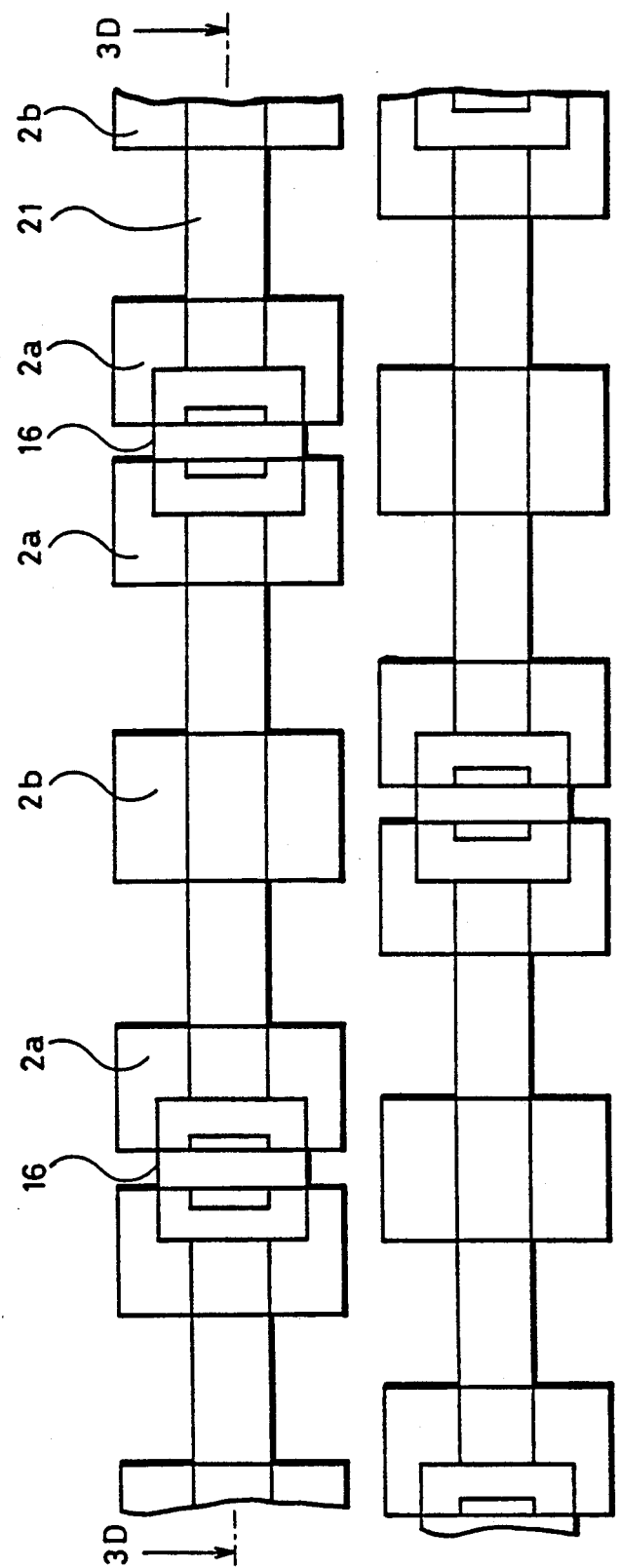
Figure 3D:
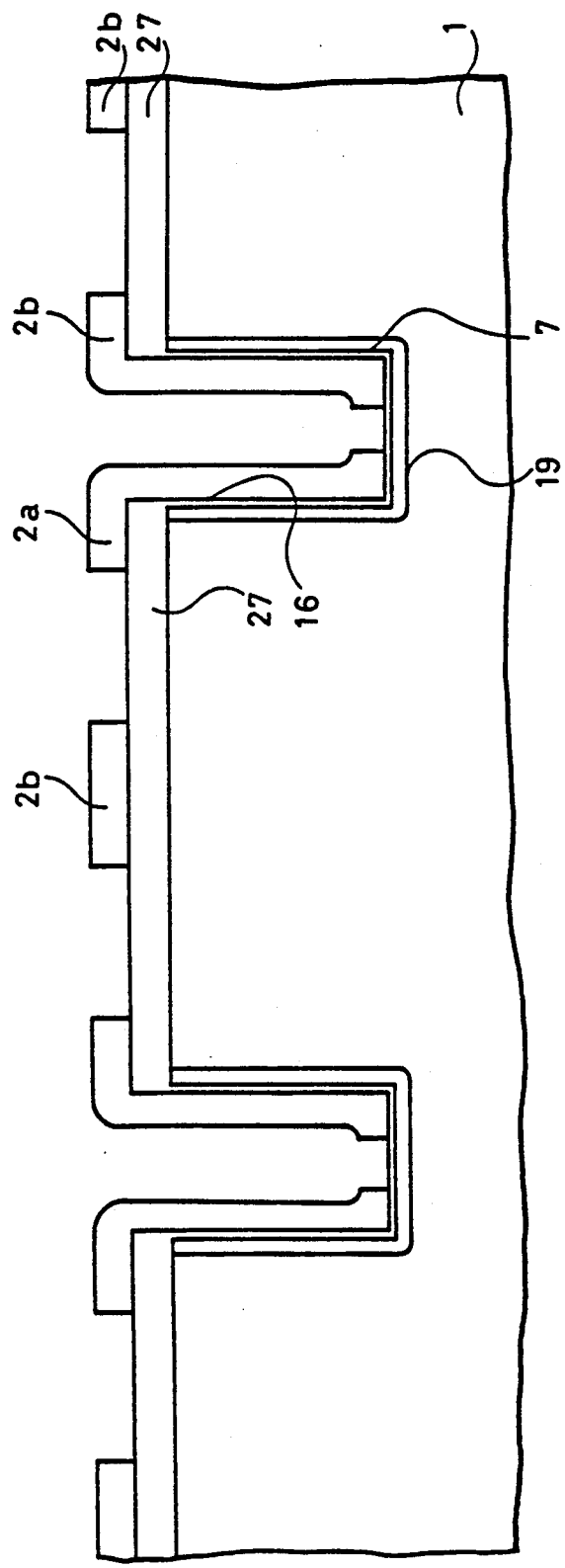

Referring to FIG. 2C and to FIG. 3D which is a sectional view taken along a line 3D—3D of FIG. 2C, the thicker silicon oxide film 25 and the silicon nitride film 24 are removed, after which a thin silicon oxide film 7 is formed on the surface of the n-type impurity layer 19. Then, a polysilicon layer is deposited on the overall surface of the substrate 1 and then regions of polysilicon layer 2a, 2b are formed by patterning.

Figure 3E:
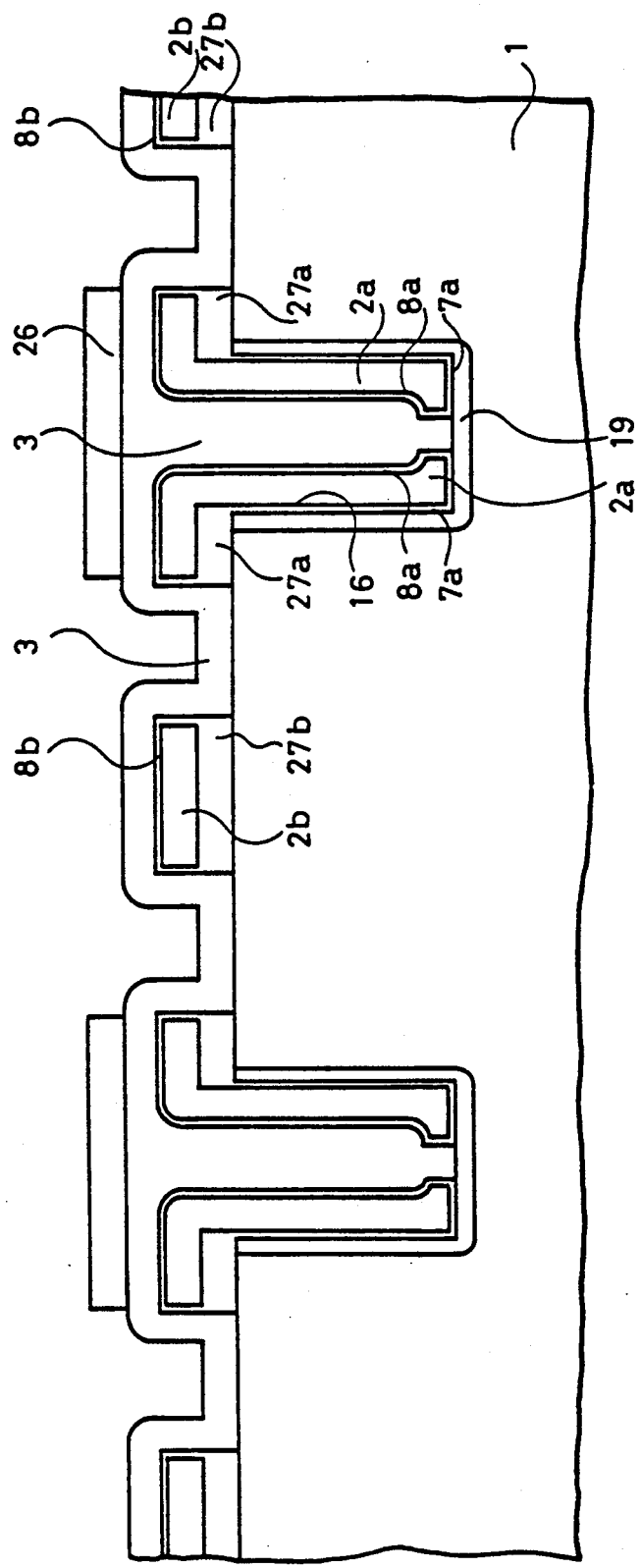

Referring to FIG. 2D and also to FIG. 3E which is a sectional view taken along a line 3E—3E of FIG. 2D, the portions of the thicker silicon oxide film 27 and the thin silicon oxide film 7 that are not covered by the polysilicon layers 2a and 2b are removed, and thin silicon oxide films 8a, 8b are formed on the exposed surfaces of the polysilicon layers 2a and 2b. Then, a polysilicon layer 3 is deposited to fill the trenches 16 and to cover the overall surface of the substrate 1 and then a resist pattern 26 is formed on the polysilicon layer 3.

Figure 3F:
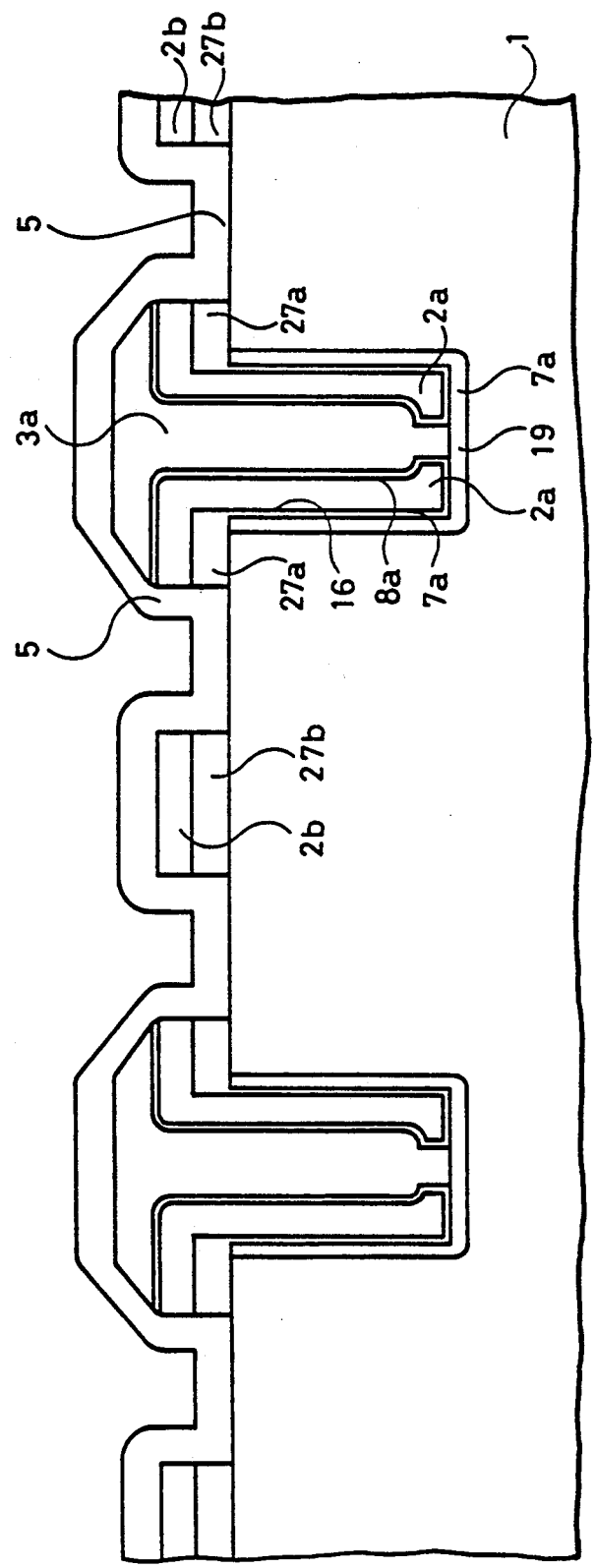

Referring to FIG. 3F, a polysilicon region 3a is formed by patterning the polysilicon layer 3 by isotropic plasma etching, using, for example a Freon gas, with the resist pattern 26 as a mask. Then, the side edges of the polysilicon layer 3a are exposed above the substrate 1, while the thin silicon oxide film 8b covering the polysilicon layer 2b is removed. Then, a polysilicon layer 5 containing n-type impurities of higher concentration is deposited on the overall surface of the substrate 1.

Figure 3G:
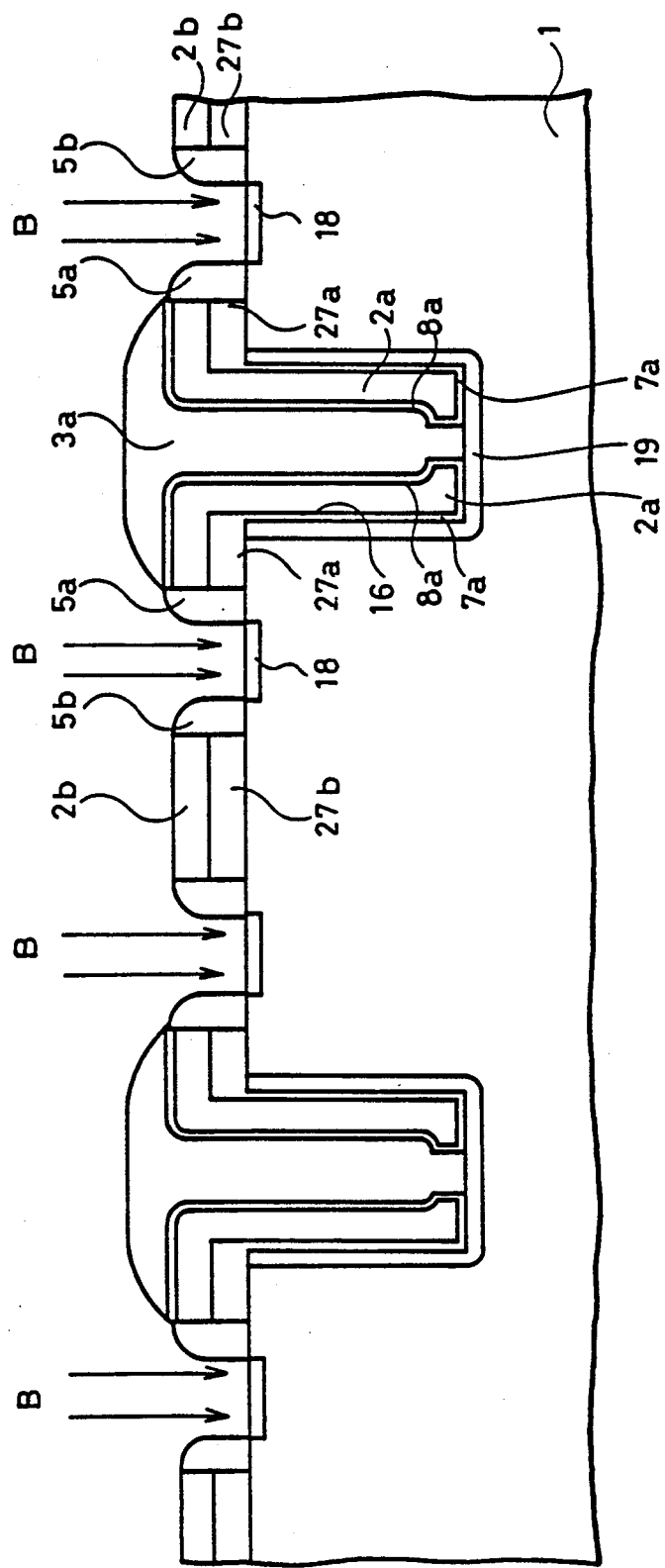

Referring to FIG. 2E and also to FIG. 3G which is a section taken along a line 3G—3G of FIG. 2, polysilicon regions 5a and 5b are formed by anisotropic etching by RIE in a direction orthogonal to the planar surface of the substrate 1. Then, p-type impurity regions 18 are formed by injecting boron by ion implantation.

Figure 3H:
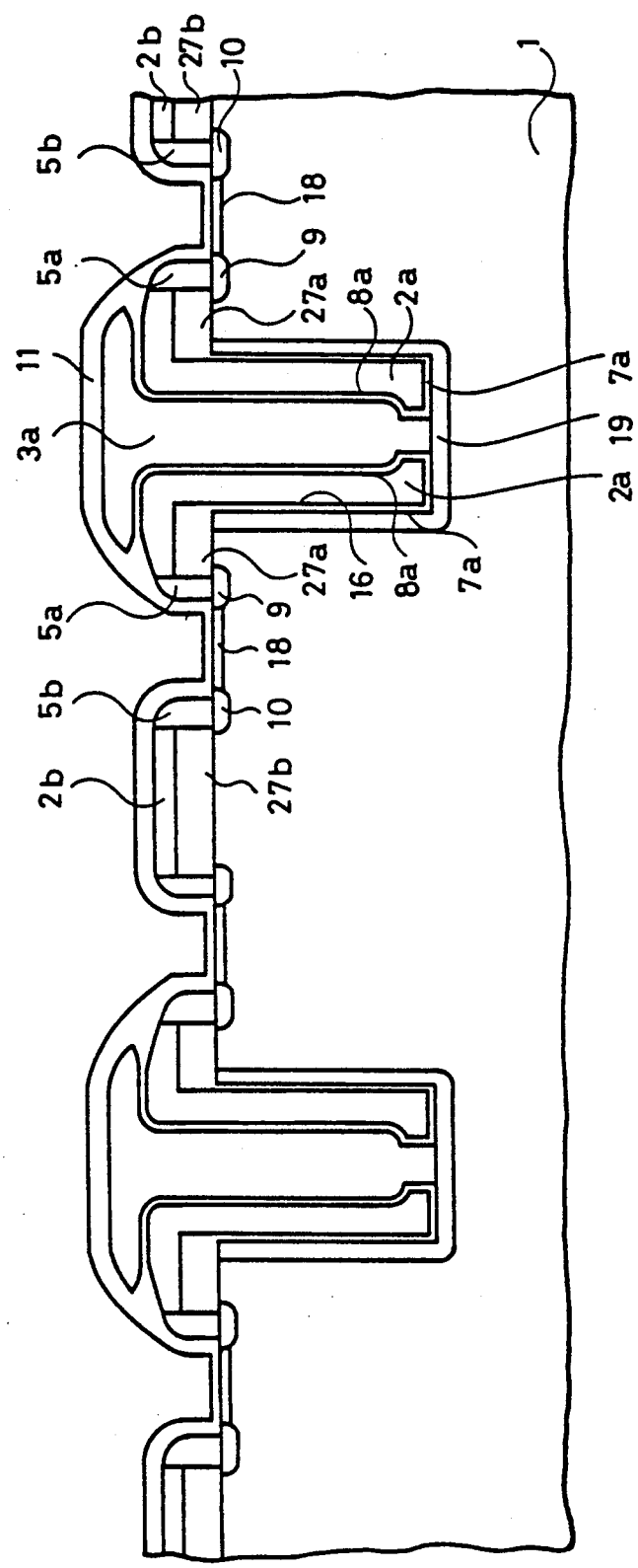
Figure 31:
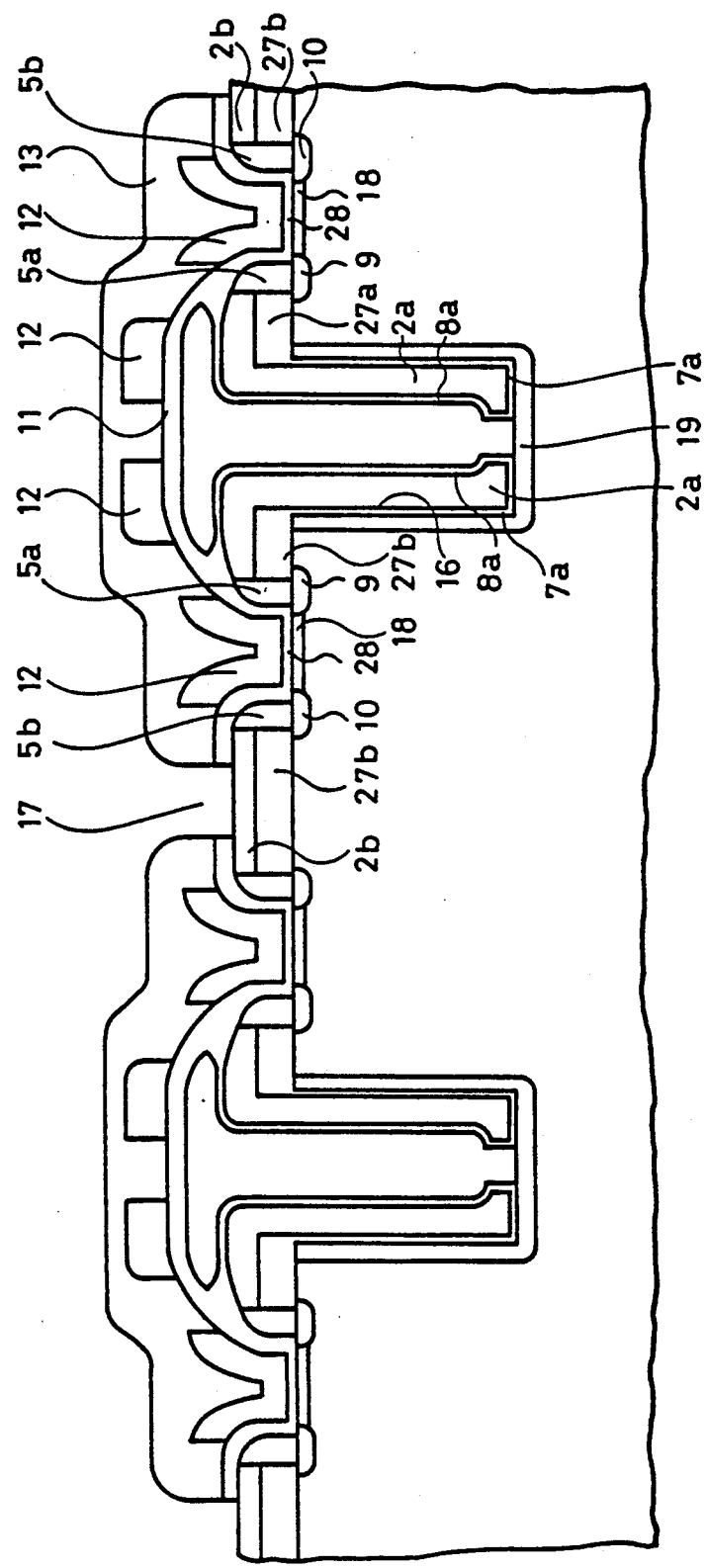
Figure 4A:
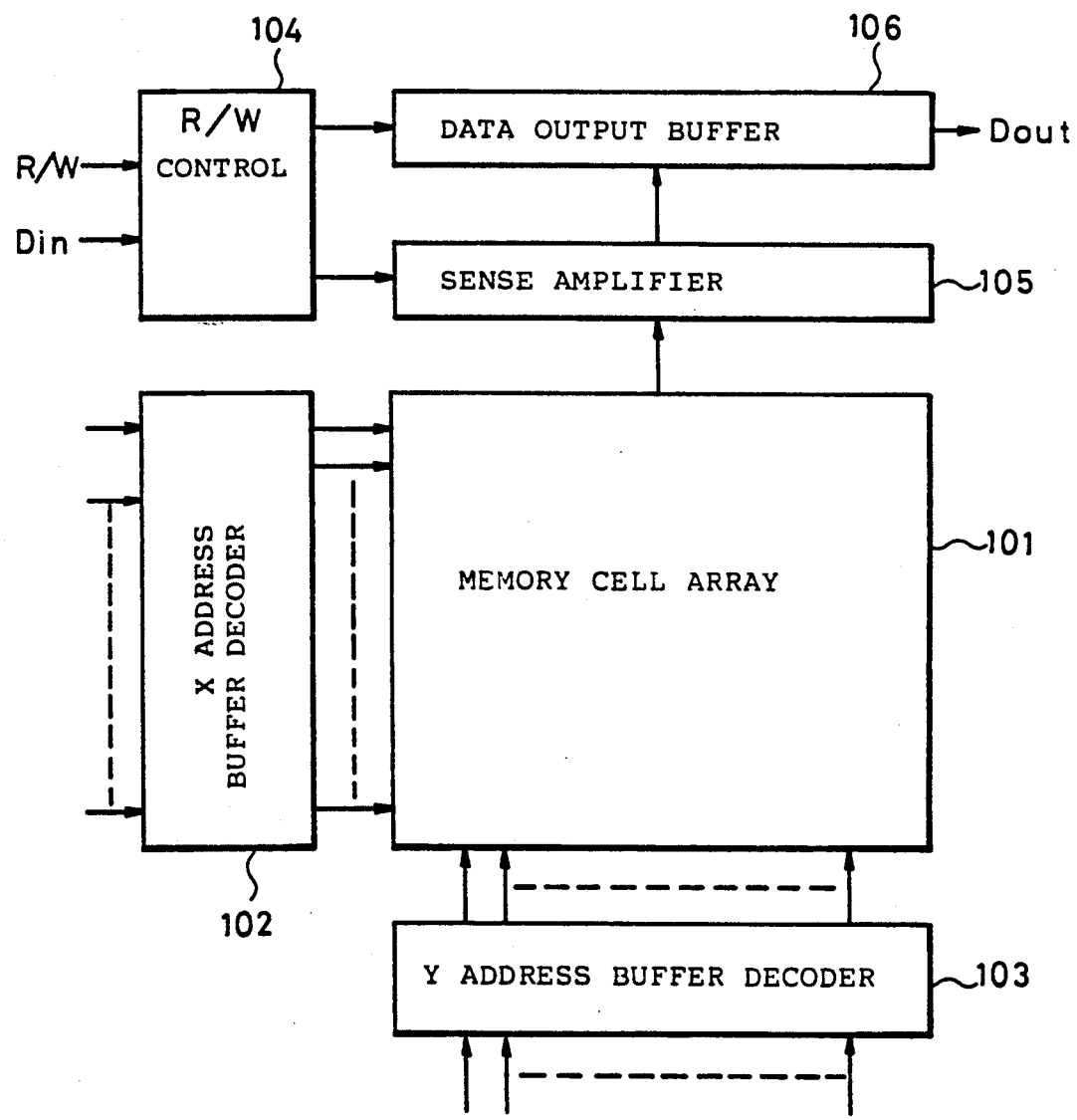
FIG. 4A is a block diagram showing an arrangement of a dynamic RAM device.
Figure 4B:
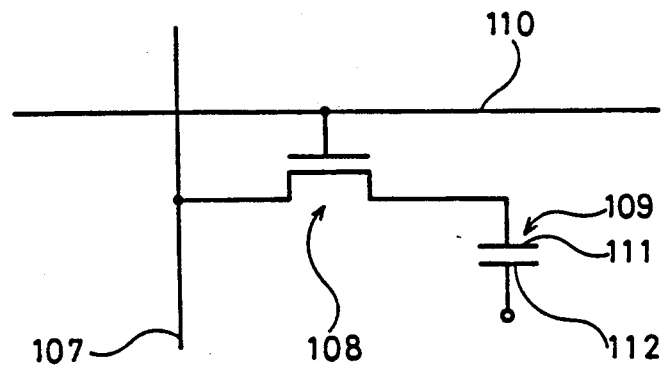
FIG. 4B is a circuit diagram showing a memory cell.
Figure 5:
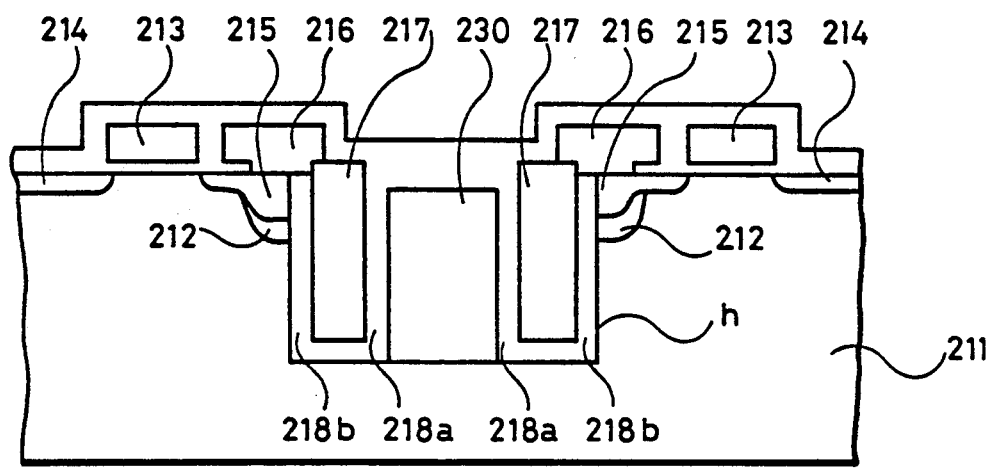
FIG. 5 is a sectional view showing a pair of semiconductor memory cells according to the prior art.

Referring to FIG. 3H, n-type impurities are diffused by heat treatment into the substrate 1 from the n-type polysilicon regions 5a and 5b for forming n-type impurity regions 9 and 10. At this time, the substrate 1 is covered by the silicon oxide film 11 caused by thermal oxidation. This silicon oxide film 11 becomes thinner in a region 28 on the p-type impurity region 18 on account of the difference in the oxidation speed between the polysilicon and the monocrystal silicon.

Referring to FIG. 3I, polysilicon word lines 12 used simultaneously as gate electrodes are formed. A silicon oxide film 13 is deposited for covering the word lines and then contact holes 17 are formed.

Ultimately, aluminum bit lines 14 connecting to the polysilicon regions 2b via the contact holes 17 are formed on the silicon oxide film 13, and a superficial protective film of silicon nitride 15 is deposited to complete the semiconductor memory device shown in FIGS. 1A and 2B.

From the foregoing, the present invention provides an arrangement in which the cell plate is isolated from the substrate by the p-n junction, so that a potential different from the substrate potential can be applied to the cell plate. In this manner, the intensity of the electrical field applied to the dielectric films of the capacitors is lowered, and the operational reliability of the semiconductor memory device is improved. Also, inasmuch as the both sides of the storage nodes of the capacitors face to the cell plate, the effective surface area of the capacitors is doubled to improve further the integration degree of the semiconductor memory device. In addition, soft errors caused by electrons produced upon injection of the α particles may also be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a p-type semiconductor substrate (1) having a planar surface, a trench (16) formed on said planar surface and having side walls and a bottom surface, a first region (19) of a capacitor cell plate formed of an n-type impurity layer on the side walls and the bottom surface of said trench, two capacitor storage nodes (2a) having the surfaces thereof covered by capacitor dielectric films (7a and 8a) and formed along the side walls of said trench for facing to each other, a second region (3a) of said cell plate formed of an electrically conductive material, said second region being interposed between said two storage nodes (2a) and connected to said first region (19) of the cell plate at the bottom surface of said trench (16), and n-channel type field effect transistors (9, 10, 12, 18 and 28) each connected to one of said storage nodes (2a) and formed on said planar surface.

2. A semiconductor memory device comprising a p-type semiconductor substrate (1) having a planar surface, a trench (16) formed on said planar surface and having side walls and a bottom surface, a first region (19) of a capacitor cell plate formed of an n-type impurity layer on the side walls and the bottom surface of said trench.

two capacitor storage nodes (2a) having the surfaces thereof covered by capacitor dielectric films (7a and 8a) and formed along the side walls of said trench for facing to each other, a second region (3a) of said cell plate formed of an electrically conductive material, said second region being interposed between said two storage nodes (2a) and connected to said first region (19) of the cell plate at the bottom surface of said trench (16), and n-channel type field effect transistors (9, 10, 12, 18 and 28) each connected to one of said storage nodes (2a) and formed on said planar surface, wherein said field effect transistors (9, 10, 12, 18, 28) each includes a source region (9), a thick interlayer insulating film (27a) is formed between the first region (19) of the cell plate and the source region (9) on said planar surface, and the storage nodes (2a) and the source region (9) are electrically connected to each other over said thick interlayer insulating film (27a) so that the insulating film (27a) also acts as an isolation film between the first region (19) of the cell plate and the source region (9).

3. A semiconductor memory device according to claim 1, wherein said pair of storage nodes are each insulated from said first region (19) of the cell plate by said dielectric film (7a) and from said second region (3a) of said cell plate by said dielectric film (8a).

4. A semiconductor memory device according to claim 3, wherein said capacitor storage nodes (2a) are formed of an electrically conductive material and are insulated from said first region (19) of the cell plate at the bottom surface of said trench.

5. A semiconductor memory device according to claim 1, wherein said capacitor storage nodes (2a) are formed of an electrically conductive material and are insulated from said first region (19) of the cell plate at the bottom surface of said trench.

6. A semiconductor memory device according to claim 1 wherein said first and second regions of said cell plate are electrically connected to enable use of plural surfaces of said storage nodes for storage.

7. A semiconductor memory device comprising:
a first conductivity type semiconductor substrate (1) having a planar surface,
a trench (16) formed on said planar surface and having side walls and a bottom surface,
a first region (19) of a capacitor cell plate formed of a second conductivity type layer on the side walls and the bottom surface of said trench,
two capacitor storage nodes (2a) each having first and second surfaces thereof covered by respective capacitor dielectric films (7a and 8a) and formed along the side walls of said trench, said two storage nodes facing each other,
a second region (3a) of said cell plate formed of an electrically conductive material, said second region being interposed between said two storage nodes (2a) and electrically connected to said first region (19) of the cell plate at the bottom surface of said trench (16), and
field effect transistors (9, 10, 12, 18 and 28) each connected to one of said storage nodes (2a) and formed on said planar surface.

8. A semiconductor memory device according to claim 7 wherein said sidewalls of said trench (16) are in a substantially opposing relationship and said two storage nodes (2a) formed along said opposing sidewalls thereby face each other in an opposing relationship.

9. A semiconductor memory device according to claim 8 wherein said dielectric films (8a) cover interior opposing surfaces of said opposing storage nodes (2a) and said dielectric films (7a) cover outer surfaces of said opposing storage nodes (2a) facing said sidewalls of said trench (16).

10. A semiconductor memory device according to claim 9 wherein said dielectric films (7a) contact said first region (19) on the sidewalls of said trench (16).

11. A semiconductor memory device according to claim 9 wherein said dielectric films (7a) further cover bottom surfaces of said opposing storage nodes (2a) facing said bottom surface of said trench (16).

12. A semiconductor memory device according to claim 11 wherein said dielectric films (7a) contact said first region (19) both on the sidewalls of said trench (16) and on said bottom surface of said trench (16).

13. A semiconductor memory device according to claim 12 wherein said dielectric films (8a) contact said second region (3a) of said cell plate interposed between said two storage nodes (2a).

14. A semiconductor memory device according to claim 10 wherein said dielectric films (8a) contact said second region (3a) of said cell late interposed between said two storage nodes (2a).

15. A semiconductor memory device according to claim 9 wherein said dielectric films (8a) contact said second region (3a) of said cell plate interposed between said two storage nodes (2a).

* * * * *